(12) United States Patent
Chawda et al.

(10) Patent No.: US 11,442,520 B2
(45) Date of Patent: Sep. 13, 2022

(54) DETERMINATION OF ONE OR MORE OPERATING PARAMETERS FOR A SWITCHED-MODE POWER SUPPLY

(71) Applicant: TEXAS INSTRUMENTS INCORPORATED, Dallas, TX (US)

(72) Inventors: Pradeep Kumar Chawda, Cupertino, CA (US); Ning Dong, Plano, TX (US); Makram Monzer Mansour, San Jose, CA (US); Jeffrey Robert Perry, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/167,587

(22) Filed: Feb. 4, 2021

(65) Prior Publication Data

US 2021/0157393 A1    May 27, 2021

Related U.S. Application Data

(63) Continuation of application No. 16/124,943, filed on Sep. 7, 2018, now Pat. No. 10,942,561.

(Continued)

(51) Int. Cl.
*G06F 1/28* (2006.01)
*G01R 31/40* (2020.01)
(Continued)

(52) U.S. Cl.
CPC ............. *G06F 1/28* (2013.01); *G01R 31/40* (2013.01); *G06F 1/26* (2013.01); *G06F 1/3296* (2013.01);
(Continued)

(58) Field of Classification Search
CPC ..... G06F 1/28; G01R 31/40; G01R 19/16528; G01R 19/2506; G06K 9/00503; G06K 9/00523
See application file for complete search history.

(56) References Cited

U.S. PATENT DOCUMENTS 7,962,109 B1 * 6/2011 Stockstad ............ H03G 3/3047
455/226.1
9,362,829 B2    6/2016 Liu
(Continued)

FOREIGN PATENT DOCUMENTS

| CN | 106787695 A | 5/2017 |
| CN | 105738836 A | 7/2017 |
| CN | 108322032 A * | 7/2018 |

OTHER PUBLICATIONS

Sehgal et al., "On-chip Real-Time Power Supply Noise Detector" 2006 IEEE (Year: 2006).*

(Continued)

*Primary Examiner* — John C Kuan
(74) *Attorney, Agent, or Firm* — Carl G. Peterson; Charles A. Brill; Frank D. Cimino

(57) ABSTRACT

A method includes obtaining a first waveform representing an output characteristic with respect to time of a switched-mode power supply. The method further includes removing a high frequency component from the first waveform to generate a modified waveform and determining a stable value of the modified waveform. The method further includes determining an operating parameter of the switched-mode power supply based on the modified waveform, the stable value, or a combination thereof. The one or parameter includes an overshoot value associated with the switched-mode power supply, an undershoot value associated with the switched-mode power supply, or a settling time associated with the switched-mode power supply. The (Continued)

method further includes outputting an indication of the parameter.

20 Claims, 7 Drawing Sheets

Related U.S. Application Data

(60) Provisional application No. 62/611,897, filed on Dec. 29, 2017, provisional application No. 62/556,216, filed on Sep. 8, 2017.

(51) Int. Cl.
| | |
|---|---|
| *G06K 9/00* | (2022.01) |
| *G06F 1/3296* | (2019.01) |
| *G06F 1/26* | (2006.01) |
| *G01R 19/165* | (2006.01) |
| *G01R 19/25* | (2006.01) |
| *G06F 17/14* | (2006.01) |

(52) U.S. Cl.
CPC .... *G01R 19/16528* (2013.01); *G01R 19/2506* (2013.01); *G06F 17/142* (2013.01); *G06K 9/00503* (2013.01); *G06K 9/00523* (2013.01)

(56) References Cited

U.S. PATENT DOCUMENTS

| | | |
|---|---|---|
| 9,389,627 B2 | 7/2016 | Kurokawa |
| 10,605,854 B2 | 3/2020 | Sathik |
| 2008/0265869 A1 | 10/2008 | Suzzoni |
| 2010/0237844 A1 | 9/2010 | Yeh |
| 2017/0149335 A1* | 5/2017 | Morroni ................. H02M 1/36 |
| 2018/0062505 A1 | 3/2018 | Soleno |

OTHER PUBLICATIONS

Kiran Y M et al., "Overview of Fault Diagnosis and Detection methods used in Switched Mode Power Supplies" 2016 IEEE (Year: 2016).*

"Gibbs Phenomenon." Retrieved from: https://en.wikipedia.org/wiki/Gibbs_phenomenon. pp. 1-9, Dec. 28, 2017.

"Settling Time." Retrieved from: https://en.wikipedia.org/wiki/Settling_time. pp. 1-2, Dec. 28, 2017.

Wikipedia, "RLC circuit" available at https://web.archive.org/web/20161125192512/https://en.wikipedia.org/wiki/RLC_circuit, 2016 (Year: 2016).

* cited by examiner

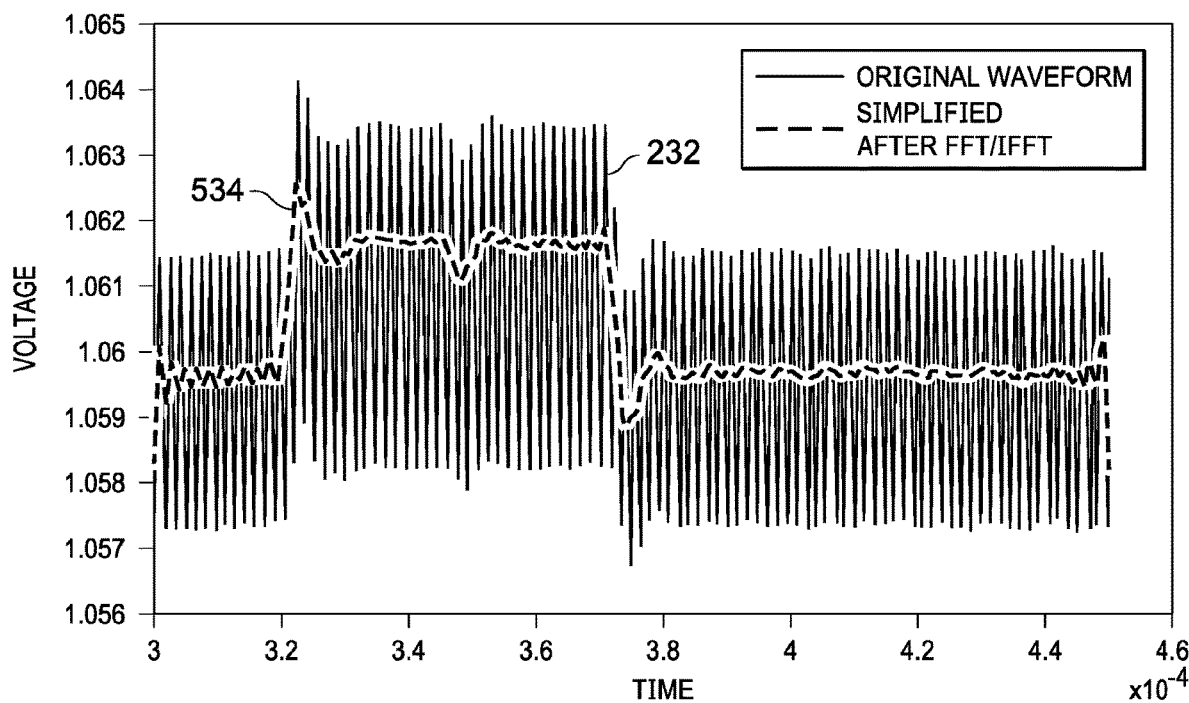
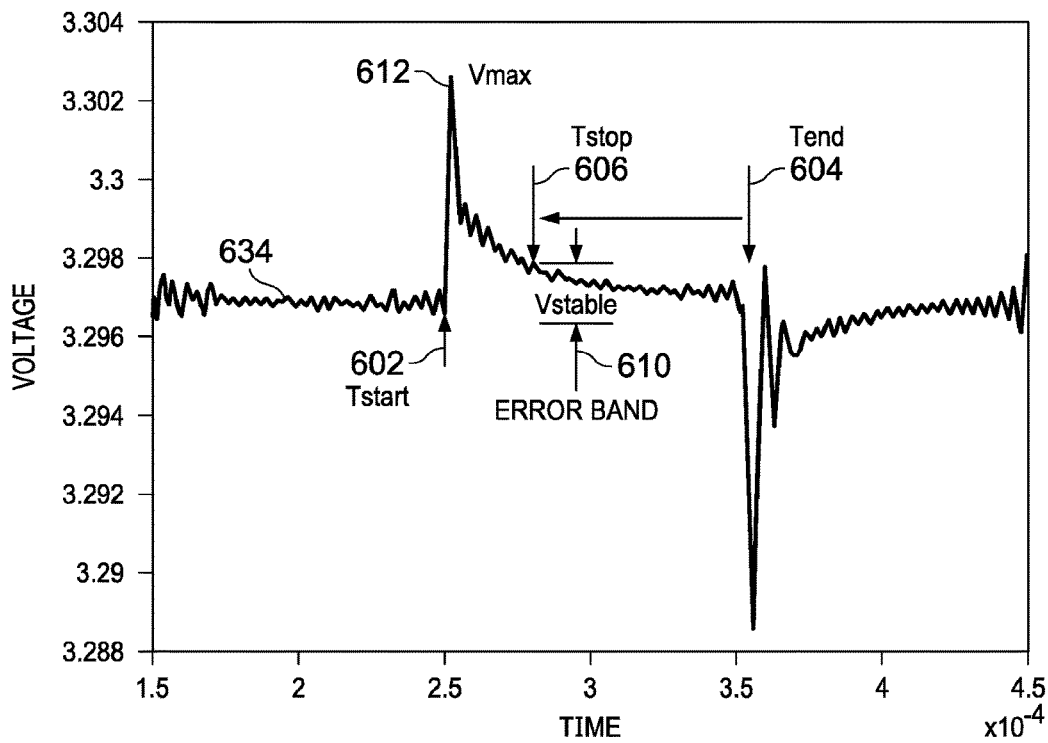

FIG. 7
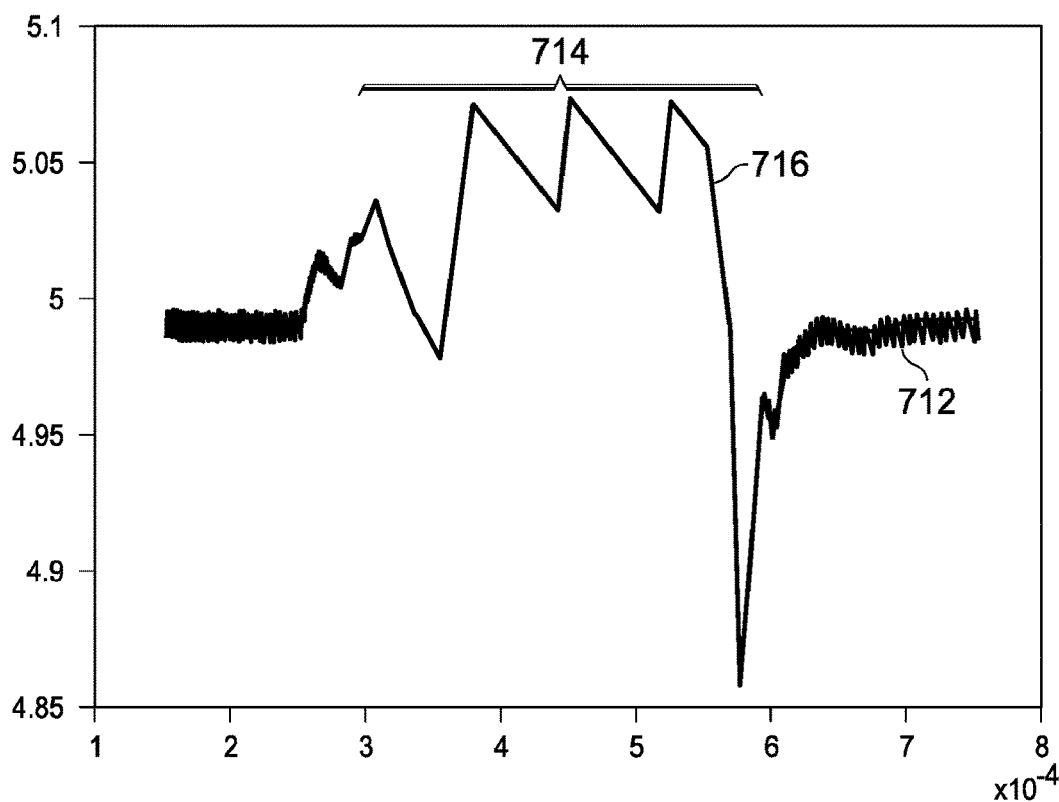
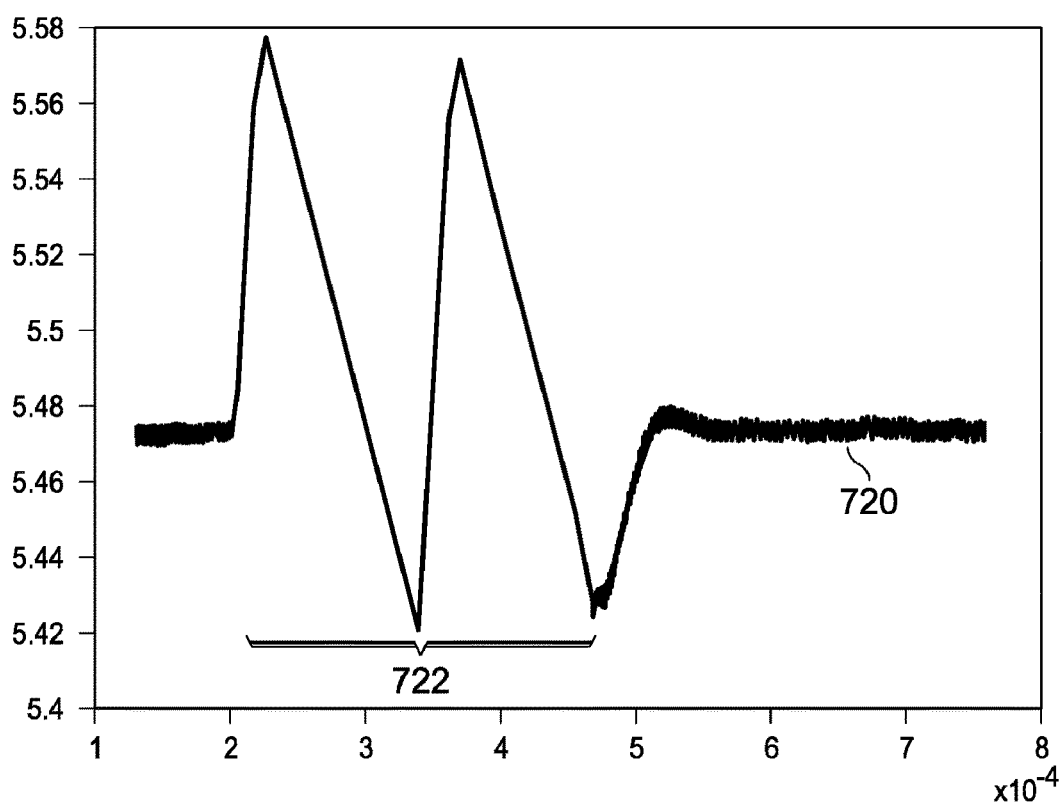

FIG. 8
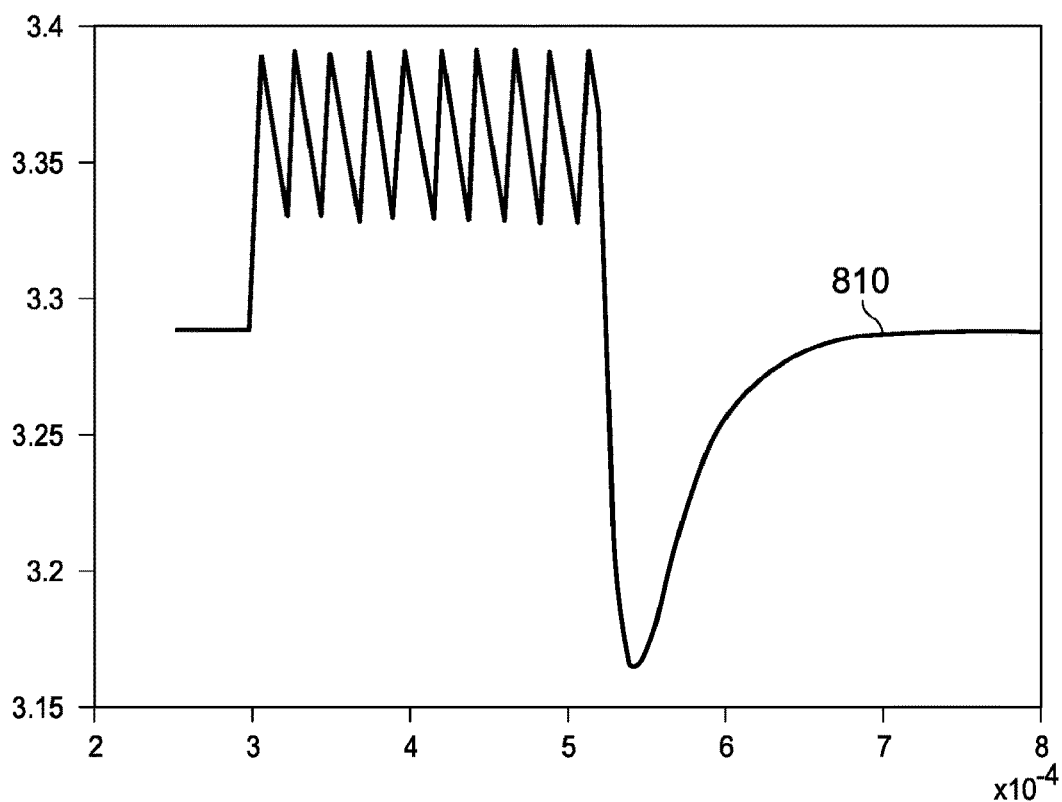
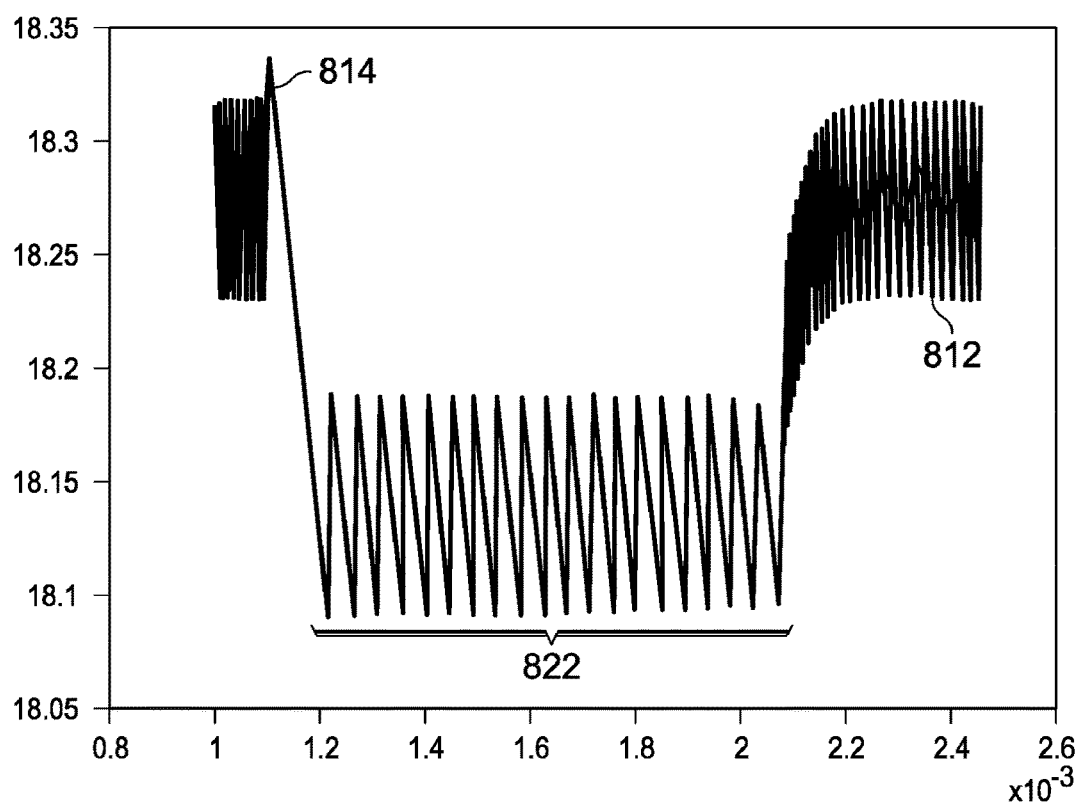

DETERMINATION OF ONE OR MORE OPERATING PARAMETERS FOR A SWITCHED-MODE POWER SUPPLY

CROSS-REFERENCE TO RELATED APPLICATIONS

This application is a continuation of U.S. patent application Ser. No. 16/124,943, filed on Sep. 7, 2018, which claims the benefit of U.S. Provisional Patent Application No. 62/556,216, which was filed on Sep. 8, 2017 and entitled "MEASURING OVERSHOOT, UNDERSHOOT AND SETTLING TIME FOR SWITCHING POWER SUPPLIES" and of U.S. Provisional Patent Application No. 62/611,897, which was filed on Dec. 29, 2017 and entitled "DETERMINATION OF ONE OR MORE OPERATING PARAMETERS FOR A SWITCHED-MODE POWER SUPPLY," the content of each of which is incorporated by reference.

BACKGROUND

A switched-mode power supply transfers power from an alternating current input source to a direct current output. In operation, the switched-mode power supply continuously switches between a high and a low state. The switched-mode power supply may be configured to provide a relatively constant output voltage. However, changes in the alternating current input or in a load of the output may result in an undershoot of the constant output voltage or an overshoot of the constant output voltage for a period of time (i.e., a settling time).

Designers may consider undershoot, overshoot, and settling time when determining whether to use a particular power supply in an electronic device. However, the continuous switching of the switched-mode power supply may render some techniques for measuring the undershoot, the overshoot, the settling time, or a combination thereof ineffective.

SUMMARY

In a particular example, a method includes obtaining a first waveform representing an output characteristic with respect to time of a switched-mode power supply. The method further includes removing a high frequency component from the first waveform to generate a modified waveform and determining a stable value of the modified waveform. The method further includes determining an operating parameter of the switched-mode power supply based on the modified waveform, the stable value, or a combination thereof. The parameter includes an overshoot value associated with the switched-mode power supply, an undershoot value associated with the switched-mode power supply, or a settling time associated with the switched-mode power supply. The method further includes outputting an indication of the parameter.

In another example, a computer readable storage device stores instructions that, when executed by one or more processors, cause the one or more processors to obtain a first waveform representing an output characteristic with respect to time of a switched-mode power supply. The instructions further cause the processor(s) to remove a high frequency component from the first waveform to generate a modified waveform. The operations instructions further cause the processor(s) to determine a stable value of the modified waveform. The instructions further cause the processor(s) to determine an operating parameter of the switched-mode power supply based on the modified waveform, the stable value, or a combination thereof. The one or more operating parameters include an overshoot value associated with the switched-mode power supply, an undershoot value associated with the switched-mode power supply, or a settling time associated with the switched-mode power supply. The instructions further cause the processor(s) to output an indication of the parameter.

In another example, an apparatus includes one or more processors and a memory storing instructions that, when executed by the one or more processors, cause the one or more processors to obtain a waveform representing an output characteristic with respect to time of a switched-mode power supply. The instructions further cause the processor(s) to remove a high frequency component from the waveform to generate a modified waveform. The instructions further cause the processor(s) to determine a stable value of the modified waveform. The instructions further cause the processor(s) to determine an operating parameter of the switched-mode power supply based on the modified waveform, the stable value, or a combination thereof. The parameter includes an overshoot value associated with the switched-mode power supply, an undershoot value associated with the switched-mode power supply, or a settling time associated with the switched-mode power supply. The instructions further cause the processor(s) to output an indication of the parameter.

BRIEF DESCRIPTION OF THE DRAWINGS

For a detailed description of various examples, reference will now be made to the accompanying drawings in which:

FIG. 5 is a diagram illustrating a third stage of the high frequency component removal process in accordance with an example;

FIG. 6 is a diagram illustrating determination of operating parameters of a switched-mode power supply in accordance with an example;

FIG. 7 includes diagram illustrating waveforms that may indicate invalid operating parameters in accordance with an example;

FIG. 8 includes additional diagrams illustrating waveforms that may indicate invalid operating parameters in accordance with an example.

DETAILED DESCRIPTION

Figure 1:
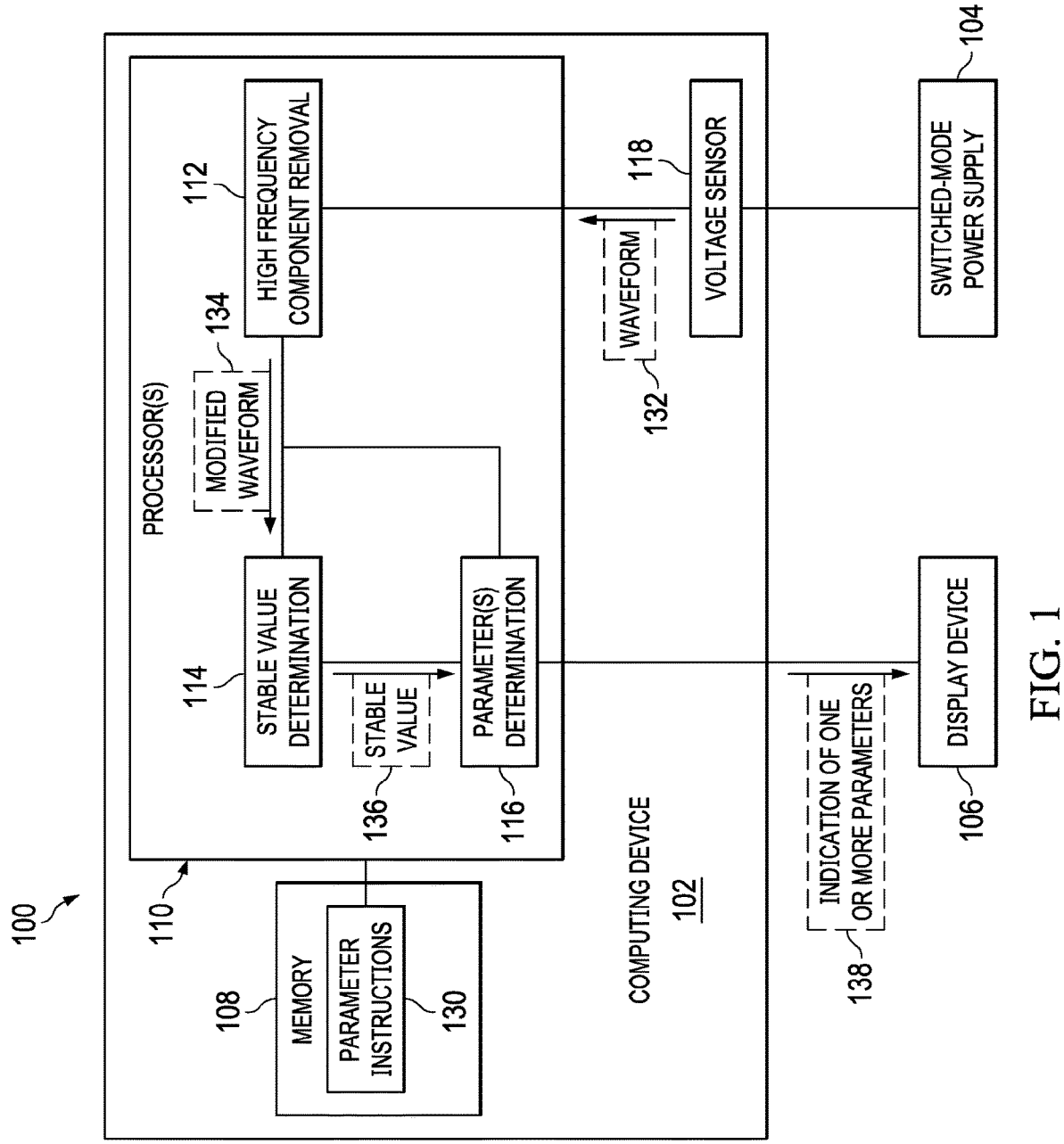
FIG. 1 is a diagram of a system for determining operating parameters of a switched-mode power supply in accordance with an example.

Referring to FIG. 1, a diagram illustrating a system 100 for determining one or more operating parameters of a switched-mode power supply is shown. In the illustrated example, the system 100 includes a computing device 102.

The computing device 102 includes a memory 108, one or more processors 110 and a voltage sensor 118. The memory 108 is a computer readable storage device, such as a random access memory device, a hard disk drive, a solid state drive, some other memory device, or a combination thereof. As used herein, a computer readable storage device refers to an article of manufacture and is not a signal. The memory 108 stores parameter instructions 130 that are executable by the processor(s) 110 to perform one or more operations described herein (e.g., with reference to FIGS. 1-9) to determine operating parameters of a switched-mode power supply 104.

The processor(s) 110 correspond to a central processing unit (CPU), a digital signal processor (DSP), some other processing device, or a combination thereof. The processor(s) 110 include a high frequency component removal module 112, a stable value determination module 114, and a parameter(s) determination module 116. Each of the modules 112-116 may correspond to dedicated hardware circuitry or to functionality provided by the processor(s) 110 responsive to executing the parameter instructions 130.

In the example of FIG. 1, the voltage sensor 118 is illustrated as a distinct component of the computing device 102 that is directly coupled to a switched-mode power supply 104 external to the computing device 102. In such embodiments, the voltage sensor 118 may correspond to a voltmeter or other device configured to detect voltage of the switched-mode power supply 104. It should be noted that in some embodiments, the voltage sensor 118 is indirectly coupled to the switched-mode power supply 104. In further alternative embodiments, the voltage sensor 118 corresponds to a virtual sensor and the switched-mode power supply 104 corresponds to a simulated switched-mode power supply. To illustrate, the voltage sensor 118 may correspond to one or more software modules executed by the processor(s) 110 and the switched-mode power supply 104 may correspond to a simulated switched-mode power supply that is simulated by the processor(s) 110 or by another device. It should be noted that in alternative embodiments, a sensor configured to detect a different output characteristic of the switched-mode power supply 104 may be included in the computing device 102 in addition or in place of the voltage sensor 118. For example, the computing device 102 may include a current sensor.

The computing device 102 is further illustrated as directly coupled to a display device 106. In alternative embodiments, the display device 106 is a component of the computing device 102 or is indirectly coupled to the computing device 102 (e.g., via the Internet or another network). The display device 106 may correspond to a display screen, to a computing device with an integrated display screen, or to some other type of display device.

In operation, the voltage sensor 118 generates a waveform 132 based on detected output voltage of the switched-mode power supply 104. In the illustrated example, the waveform 132 indicates the output voltage with respect to time of the switched-mode power supply 104. It should be noted that in alternative examples in which the computing device 102 includes a different type of sensor, the waveform 132 may indicate a different output characteristic with respect to time of the switched-mode power supply 104. For example, the waveform may indicate current with respect to time of the switched-mode power supply 104.

The high frequency component removal module 112 removes a high frequency component of the waveform 132 to generate a modified waveform 134. Removing the high frequency component of the waveform 132 is described further below with reference to FIGS. 3-5.

The stable value determination module 114 determines a stable value 136 in the modified waveform 134. Determination of the stable value 136 is described further below with reference to FIG. 6. The parameter(s) determination module 116 determines one or more operating parameters of the switched-mode power supply 104 based on the stable value 136 and the modified waveform 134. Determination of the one or more operating parameters is described further below with reference to FIG. 6. The one or more operating parameters may include an undershoot value of the switched-mode power supply 104, an overshoot value of the switched-mode power supply 104, a settling time of the switched-mode power supply 104, or a combination thereof. In some implementations, the processor(s) 110 are configured to initiate storage of the one or more operating parameters locally at the computing device 102 and/or at a remote device.

The processor 110 outputs an indication 138 of the one or more parameters for display at the display device 106. In some implementations, the processor 110 outputs the indication 138 in response to the one or more operating parameters satisfying a parameter criterion of a search query received from the display device 106. To illustrate, the processor 110 may receive a search query from the display device 106 requesting identification of a switched-mode power supply that has a settling time of 0.00005 seconds or less. In response to determining that the switched-mode power supply 104 has a settling time of 0.00005 seconds or less, the processor(s) 110 may output an indication identifying the switched-mode power supply 104 and the settling time of the switched-mode power supply 104.

Thus, FIG. 1 illustrates a system that may be used to identify one or more operating parameters of a switched-mode power supply. The system of FIG. 1 may be more accurate than other systems because the system of FIG. 1 removes a high frequency component from a waveform associated with an output characteristic (e.g., voltage) of the switched-mode power supply. Accordingly, a device designer or automated device design system may utilize the system of FIG. 1 to develop more precise device designs.

FIGS. 2-6 illustrate representations of various stages of processing a waveform to determine one or more operating parameters of a switched-mode power supply. The process illustrated in FIGS. 2-6 may be performed by the processor(s) 110 of FIG. 1.

Figure 2:
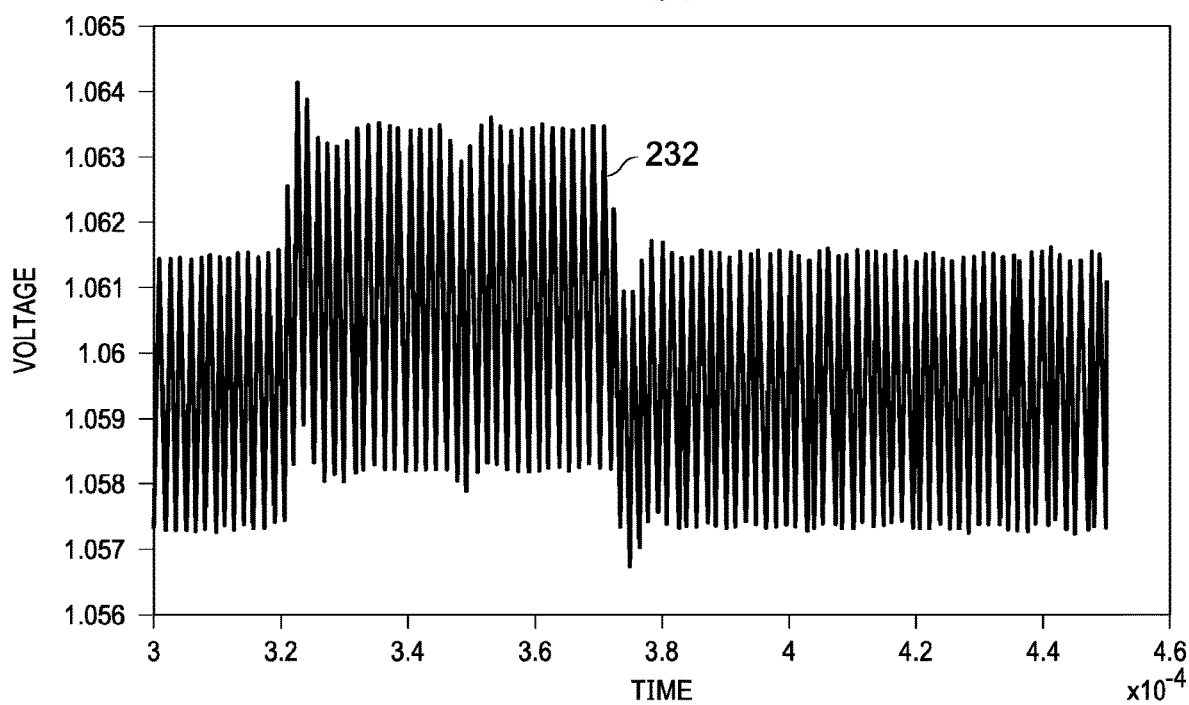
FIG. 2 is a diagram of a waveform used to determine operating parameters of a switched-mode power supply in accordance with an example.

Referring to FIG. 2, a diagram 200 illustrating a waveform used to determine one or more operating parameters of a switched-mode power supply is shown. The diagram 200 includes a depiction of an original waveform 232. The original waveform may correspond to the waveform 132 of FIG. 1. As illustrated, the original waveform 232 represents voltage with respect to time of a switched-mode power supply (e.g., the switched-mode power supply 104). The original waveform 232 may be generated by the voltage sensor 118.

Figure 3:
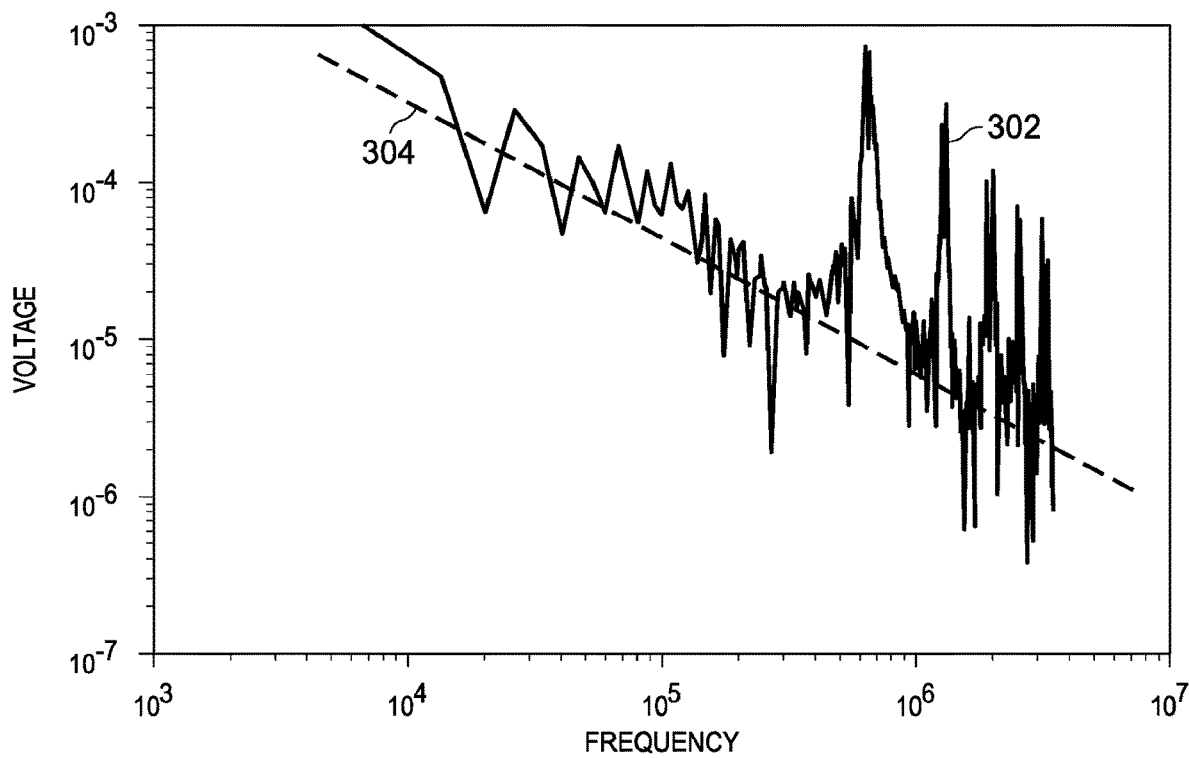
FIG. 3 is a diagram illustrating a first stage of a high frequency component removal process in accordance with an example.

Referring to FIG. 3, a diagram 300 illustrating a stage of a high frequency component removal process is shown. As part of the high frequency component removal process, the high frequency component removal module 112 may transform the original waveform 232 into a frequency domain waveform 302. For example, the high frequency component removal module 112 may apply a fast Fourier transform operation to the original waveform 232 to generate the frequency domain waveform 302.

As part of the high frequency component removal process, the high frequency component removal module 112 may perform a detrend operation on the frequency domain waveform 302. As illustrated in FIG. 3, the high frequency component removal module 112 may identify a trend line 304 as part of the detrend operation. The high frequency component removal module 112 may subtract the trend line 304 from the frequency domain waveform 302 to generate a detrended waveform 402 as illustrated in diagram 400 of FIG. 4. In some examples, the trend line 304 corresponds to a least-square linear fitting of the frequency domain waveform 302.

As part of the high frequency component removal process, the high frequency component removal module 112 may apply a low pass filter to the detrended waveform 402. The high frequency component removal module 112 may identify a frequency cutoff (or a cutoff frequency) of the low pass filter and set frequencies of the detrended waveform 402 greater than the frequency cutoff to zero. In a particular example, the high frequency component removal module 112 identifies the frequency cutoff by identifying top-m highest peaks in a second half of the detrended waveform 402 and then identifying a lowest dip that occurs in the detrended waveform 402 before the top-m highest peaks. The high frequency component removal module 112 may set the frequency cutoff to a value of the lowest dip (e.g., set the cutoff frequency to a frequency value corresponding to where the lowest dip is at a minimum). In some examples, m is equal to 3, 4, or 5. In the illustrated example, the high frequency component removal module 112 identifies a first peak 404, a second peak 406, and a third peak 408 as the top-3 highest peaks in the detrended waveform 402. The high frequency component removal module 112 further identifies a dip 410 as the lowest dip in the detrended waveform 402 that occurs before the first peak 404 of the identified top-3 highest peaks. Accordingly, in the illustrated example, the high frequency component removal module 112 sets the frequency cutoff of the low pass filter to a particular frequency value of the dip 410 and generates a filtered waveform by setting spectrum of the detrended waveform 402 beyond the frequency cutoff (e.g., to the right of dashed line 412) to zero.

As part of the high frequency component removal process, the high frequency component removal module 112 may further transform the filtered waveform into a time domain to generate a modified waveform 534 as illustrated in diagram 500 of FIG. 5. The modified waveform 534 may correspond to the modified waveform 134 of FIG. 1. The diagram 500 depicts the original waveform 232 superimposed with the modified waveform 534. As illustrated, the modified waveform 534 retains a same basic shape as the original waveform 232 but a high frequency component of the original waveform 232 has been removed. Thus, FIGS. 2-5 depict stages of a high frequency component removal process that may be used to generate a simplified waveform representing an output characteristic (e.g., voltage) with respect to time of a switched-mode power supply. The simplified waveform may be used to determine operating parameters of the switched-mode power supply, as described further below.

Referring to FIG. 6, a diagram 600 illustrating determination of operating parameters of a switched-mode power supply. The diagram 600 depicts a modified waveform 634 that may be generated by the processor 110. The modified waveform 634 may correspond to the modified waveform 134. The modified waveform 634 may be generated by the from an original waveform by the high frequency component removal module 112 using the high frequency component removal process described with reference to FIGS. 2-5. As part of the stable value determination process described above, the stable value determination module 114 may identify a time window associated with a voltage (or other output characteristic) change event. For example, the switched-mode power supply 104 or a simulator may transmit metadata identifying output characteristic (e.g., voltage) change events to the processor 110. Based on the metadata, the stable value determination module 114 may identify that the switched-mode power supply 104 was set to output a particular voltage at a first time 602 (e.g., Tstart) and was set to output a different voltage at a second time 604 (e.g., Tend). The time between the first time 602 (e.g., Tstart) and the second time 604 (e.g., Tend) corresponds to a time window associated with the particular voltage. To determine a stable value of the modified waveform 634, the stable value determination module 114 may determine an error band 610 associated with the switched-mode power supply 104 outputting a particular voltage. The error band may be determined based on the original waveform (e.g., such as the waveform 132 of FIG. 1) used to generate the modified waveform 634. In a particular example, the error band 610 is equal to the particular voltage ±x+y(peak-to-peak voltage), where x and y are constants and the peak-to-peak voltage is a difference between a highest voltage and a lowest voltage of the original waveform within the time window defined by the first time 602 and the second time 604. The stable value determination module 114 may select x and y based on the original waveform. For example, x may be selected based on heuristic analysis of the original waveform and y may be selected based on regression analysis of the original waveform. X may represent "relative tolerance" and y may represent "absolute tolerance."

The stable value determination module 114 may determine a stable value (e.g., the stable value 136 of FIG. 1) of the modified waveform 634 within the time window based on the error band 610. In the illustrated example, the stable value determination module 114 may start at the second time 604 (e.g., Tend) and traverse the modified waveform 634 backwards through time to identify a third time 606 time (e.g., Tstop) at which peak to peak ripple of the modified waveform 634 exceeds or is less than the error band 610. In the illustrated example of FIG. 6, the stable value determination module 114 ignores a portion of the time window proximate to the second time 604 when identifying the third time 606 to compensate for the Gibb's effect. In a particular example, the stable value determination module 114 divides the time window a set of smaller time windows and calculates average peak to peak ripple for each smaller time window. If a first smaller time window proximate the second time 604 has a greater average peak to peak ripple than the next smaller time window, the stable value determination module 114 ignores the first smaller time window when determining the stable value.

Once the stable value determination module 114 has determined the third time 606, the stable value determination module 114 may identify the stable value (e.g., Vstable) of the time window as the average voltage of the modified waveform 634 between the third time 606 and the second time 604. In some embodiments, the stable value determination module 114 may continue to ignore the portion of the time window proximate to the second time 604 when calculating the stable value.

The parameter(s) determination module 116 may determine a maximum voltage 612 (e.g., Vmax) of the modified waveform 634 within the time window and calculate an overshoot of the switched-mode power supply 104 by subtracting the stable value from the maximum voltage 612 (e.g., Vmax−Vstable). Alternatively, the parameter(s) determination module 116 may determine a minimum voltage of the modified waveform 634 within the time window and calculate an undershoot of the switched-mode power supply 104 by subtracting the minimum voltage from the stable value. Further, the parameter determination module 116 may determine a settling time of the switched-mode power supply 104 by subtracting the first time 602 from the third time 606 (e.g., Tstop−Tstart). In some implementations, the parameter determination module 116 may determine a first settling time associated with overshoot and a second settling time associated with undershoot.

Thus, FIG. 6 depicts a process by which a device may determine one or more parameters of a switched-mode power supply based on a simplified (e.g., modified) waveform, a stable value of the modified waveform, or a combination thereof. The simplified waveform may enable more accurate calculation of one or more parameters of the switched-mode power supply.

The processor 110 may further be configured to perform a verification process to determine whether parameters detected by the parameter determination module 116 are valid. The processor 110 may perform the verification process by comparing characteristics of a waveform (e.g., the 132) and/or characteristics of a modified waveform (e.g., the modified waveform 134) to expected characteristics. In response to determining that the parameters are invalid, the processor 110 may be configured to generate an error message in addition to or instead of outputting and/or storing the invalid parameters. FIGS. 7 and 8 depict examples in which the processor may determine parameters determined based on a modified waveform are invalid.

To illustrate, FIG. 7 includes a first diagram 702 depicting a modified waveform 712. The modified waveform 712 may correspond to the modified waveform 134. The modified waveform 712 includes a time window 714 associated with the switched-mode power supply 104 operating at a particular voltage. In response to determining that a maximum voltage 716 within the time window 714 occurs at a time within a threshold time of an end of the time window 714, the processor 110 may generate an error.

FIG. 7 further includes a second diagram 704 depicting a modified waveform 720. The modified waveform 720 may correspond to the modified waveform 134. The modified waveform 720 includes a time window 722 associated with the switched-mode power supply 104 operating at a particular voltage. In response to determining that no stable value exists within the time window 722, the processor 110 may generate an error.

FIG. 8 includes a third diagram 802 depicting a modified waveform 810. The modified waveform 810 may correspond to the modified waveform 134. In response to determining that an overall shape of the modified waveform 810 does not correspond to an expected waveform shape, the processor 110 may generate an error. The processor 110 may determine whether the overall shape corresponds to an expected waveform shape based on a machine learning process used to classify waveforms.

FIG. 8 further includes a fourth diagram 804 depicting a modified waveform 810. The modified waveform 812 may correspond to the modified waveform 134. In response to determining that maximum voltage 814 of a time window 822 is incorrect, the processor 110 may generate an error. The processor 110 may determine that the maximum voltage 814 is incorrect based on the maximum voltage 814 exceeding a previous average voltage while the time window 822 is associated with a drop in voltage of the switched-mode power supply 104.

Thus, FIGS. 7 and 8 illustrate various examples in which a system may determine that identified parameters of switched-mode power supply are invalid.

Figure 9:
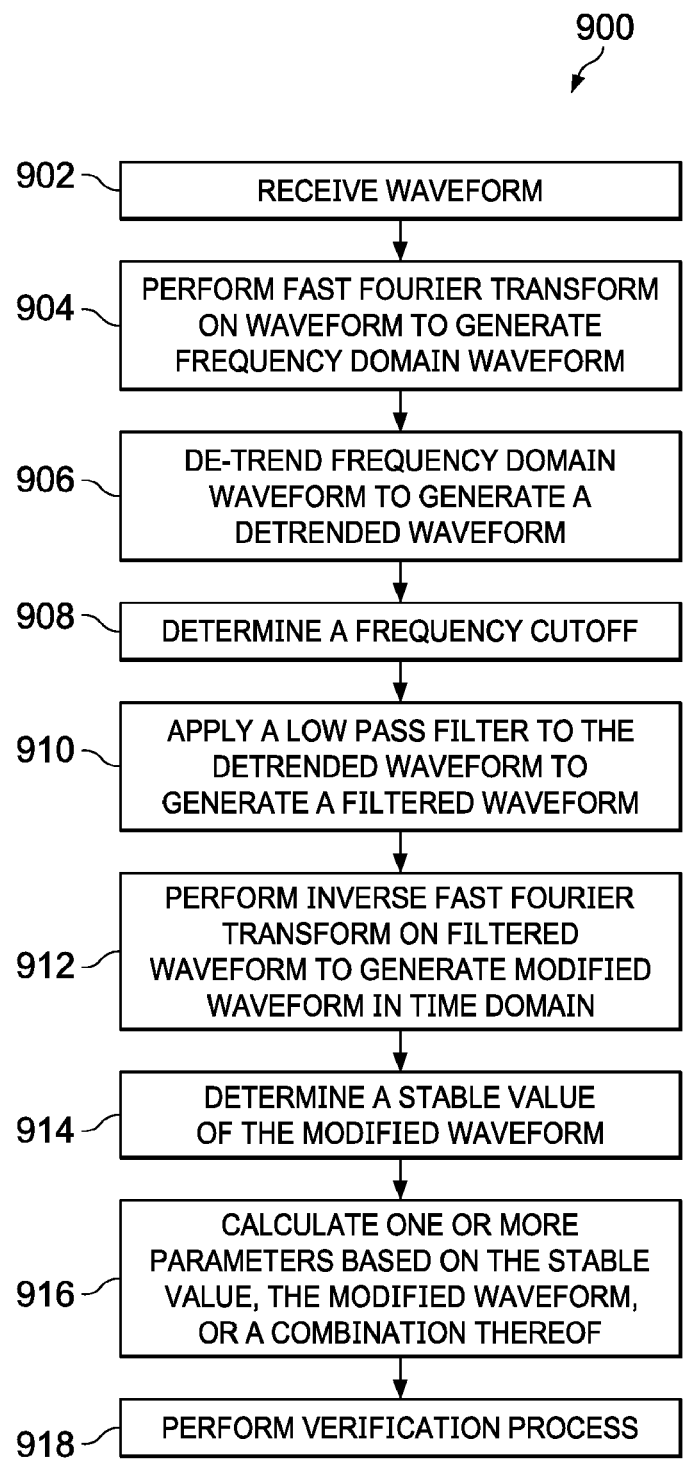
FIG. 9 is a flowchart illustrating a method for determining one or more operating parameters of a switched-mode power supply in accordance with an example.

Referring to FIG. 9, a flowchart illustrating a method 900 for identifying an operating parameter of a switched-mode power supply is shown. The method 900 may be performed by the processor 110 (e.g., executing the parameter instructions 130).

The method 900 includes receiving a waveform, at 902. For example, the processor 110 may receive the waveform 132 representing voltage of the switched-mode power supply 104 over time. In other examples, the waveform may correspond to a different output characteristic of the switched-mode power supply 104 over time. For example, the waveform may correspond to current over time. As explained above, the switched-mode power supply 104 may correspond to a physical or simulated switched-mode power supply.

The method 900 further includes performing a fast Fourier transform on the waveform to generate a frequency domain waveform, at 904. For example, the high frequency component removal module 112 may perform a fast Fourier transform on the waveform 132 to generate a frequency domain waveform. Transformation of a signal into the frequency domain is illustrated in FIGS. 2-3.

Figure 4:
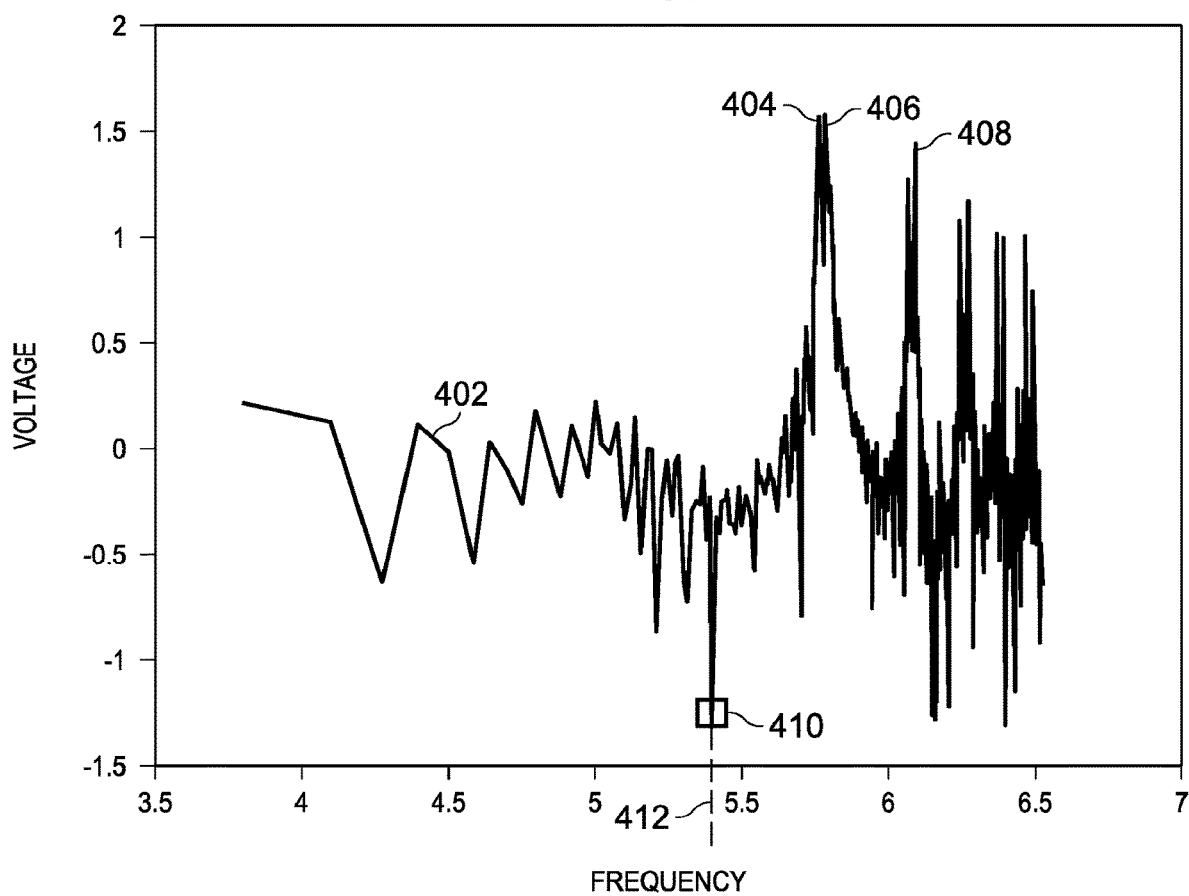
FIG. 4 is a diagram illustrating a second stage of the high frequency component removal process in accordance with an example.

The method 900 further includes de-trending the frequency domain waveform to generate a detrended waveform, at 906. For example, the high frequency component removal module 112 may perform a de-trending operation on the frequency domain waveform. Detrending a frequency domain waveform is illustrated in FIGS. 3-4.

The method 900 further includes determining a frequency cutoff, at 908. For example, the high frequency component removal module 112 may determine a frequency cutoff for the detrended waveform. Determination of a frequency cutoff is illustrated in FIG. 4.

The method 900 further includes applying a low pass filter to the detrended waveform, at 910, to generate a filtered waveform. For example, the high frequency component removal module 112 may apply a low pass filter to the detrended waveform to generate a filtered waveform.

The method 900 further includes performing an inverse fast Fourier transform on the filtered waveform to generate a modified waveform in the time domain, at 912. For example, the high frequency component removal module 112 may perform an inverse fast Fourier transform on the filtered waveform to generate the modified waveform 134.

The method 900 further includes determining a stable value of the modified waveform, at 914. For example, the stable value determination module 114 may determine the stable value 136 of the modified waveform 134. Determination of a stable value is illustrated in FIG. 6.

The method 900 further includes calculating one or more parameters based on the stable value, the modified waveform, or a combination thereof, at 916. For example, the parameter(s) determination module 116 may determine one or more operating parameters of the switched-mode power supply 104 based on the modified waveform 134, the stable value 136, or a combination thereof.

The method 900 further includes performing a verification process, at 918. For example, the processor 110 may determine whether the one or more operating parameters are valid based on the modified waveform 134, the waveform 132, or a combination thereof. FIGS. 7 and 8 describe various examples in which parameters are invalidated.

Thus, FIG. 9 illustrates a method that may be used to determine operating parameters of a switched-mode power supply. Because the method simplifies a waveform by removing a high frequency component before determining the operating parameters, the method may accurately determine the operating parameters.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of measuring operating parameters for a switched-mode power supply, comprising:
   obtaining from a sensor an output waveform representing an output of the switched-mode power supply over a time window at a transition of that output from a first output level to a second output level;
   removing a high frequency component from the output waveform to generate a modified waveform;
   determining a stable value of the modified waveform over a portion of the time window by at least:
      determining an error band based on the output waveform; and
      identifying a first time at which a voltage level of the modified waveform exceeds or is less than the error band, wherein the portion of the time window is bounded by the first time;
   determining, based on the modified waveform and the stable value, an overshoot value at the output of the switched-mode power supply and an undershoot value at the output of the switched-mode power supply; and
   outputting indications of the overshoot and undershoot values.

2. The method of claim 1, wherein removing the high frequency component comprises:
   transforming the output waveform into a frequency domain waveform by applying a fast Fourier transform to the output waveform;
   applying a low pass filter to the frequency domain waveform to generate a filtered waveform; and
   transforming the filtered waveform into time domain by applying an inverse fast Fourier transform to the filtered waveform.

3. The method of claim 1, wherein removing the high frequency component comprises:
   transforming the output waveform into a frequency domain waveform;
   calculating a least-square linear fitting of the frequency domain waveform; and
   subtracting the least-square linear fitting from the frequency domain waveform to generate a detrended waveform.

4. The method of claim 3, wherein removing the high frequency component further comprises:
   identifying a preselected number of highest peaks in a second half of the detrended waveform;
   identifying a lowest dip in the detrended waveform before a first peak of the identified highest peaks, the lowest dip having a particular frequency value; and
   generating a filtered waveform by setting spectrum beyond the particular frequency value to zero.

5. The method of claim 1, further comprising:
   determining, based on the modified waveform and the stable value, a value of a settling time at the output of the switched-mode power supply; and
   outputting an indication of the settling time value.

6. The method of claim 1,
   wherein determining the stable value further comprises identifying a second time associated with the transition from the first output level to the second output level, and
   wherein the portion of the time window is bounded by the first and second times.

7. The method of claim 1, wherein determining the stable value further comprises:
   identifying a second time associated with the transition from the first output level to the second output level;
   calculating a first peak-to-peak ripple for a first sub-window proximate the second time;
   calculating a second peak-to-peak ripple for a second sub-window proximate the first sub-window; and
   establishing the portion of the time window to not include the first sub-window in response to determining that the first peak-to-peak ripple is greater than the second peak-to-peak ripple.

8. The method of claim 1, wherein determining the error band comprises determining a voltage range of the error band based on a heuristic analysis of the output waveform.

9. A non-transitory computer readable storage device storing instructions that, when executed by one or more processors, cause the one or more processors to measure operating parameters for a switched-mode power supply by a plurality of operations comprising:
   obtaining from a sensor an output waveform representing an output of the switched-mode power supply over a time window at a transition of that output from a first output level to a second output level;
   removing a high frequency component from the output waveform to generate a modified waveform;
   determining a stable value of the modified waveform over a portion of the time window by at least:
      determining an error band based on the output waveform; and
      identifying a first time at which a voltage level of the modified waveform exceeds or is less than the error band, wherein the portion of the time window is bounded by the first time;
   determining, based on the modified waveform and the stable value, an overshoot value at the output of the switched-mode power supply and an undershoot value at the output of the switched-mode power supply; and outputting indications of the overshoot and undershoot values.

10. The computer readable storage device of claim 9, wherein removing the high frequency component comprises:
    transforming the output waveform into a frequency domain waveform by applying a fast Fourier transform to the output waveform;
    applying a low pass filter to the frequency domain waveform to generate a filtered waveform; and
    transforming the filtered waveform into time domain by applying an inverse fast Fourier transform to the filtered waveform.

11. The computer readable storage device of claim 9, wherein removing the high frequency component comprises:
    transforming the output waveform into a frequency domain waveform;
    calculating a least-square linear fitting of the frequency domain waveform; and
    subtracting the least-square linear fitting from the frequency domain waveform to generate a detrended waveform.

12. The computer readable storage device of claim 11, wherein removing the high frequency component further comprises:
    identifying a preselected number of highest peaks in a second half of the detrended waveform;
    identifying a lowest dip in the detrended waveform before a first peak of the identified highest peaks, the lowest dip having a particular frequency value; and
    generating a filtered waveform by setting spectrum beyond the particular frequency value to zero.

13. The computer readable storage device of claim 9, wherein the instructions further cause the one or more processors to receive a search query indicating a parameter criterion, wherein the indications are output in response to an operating parameter satisfying the parameter criterion.

14. The computer readable storage device of claim 9, wherein the instructions further cause the one or more processors to:
    determine, based on the modified waveform and the stable value, a value of a settling time at the output of the switched-mode power supply; and
    output an indication of the settling time value.

15. The computer readable storage device of claim 9, wherein determining the stable value further comprises identifying a second time associated with the transition from the first output level to the second output level, and
    wherein the portion of the time window is bounded by the first and second times.

16. The computer readable storage device of claim 9, wherein determining the stable value further comprises:
    identifying a second time associated with the transition from the first output level to the second output level;
    calculating a first peak-to-peak ripple for a first sub-window proximate the second time;
    calculating a second peak-to-peak ripple for a second sub-window proximate the first sub-window; and
    establishing the portion of the time window to not include the first sub-window in response to determining that the first peak-to-peak ripple is greater than the second peak-to-peak ripple.

17. An apparatus configured to measure operating parameters for a switched-mode power supply, the apparatus comprising:
    one or more processors; and
    a memory storing instructions that, when executed by the one or more processors, cause the one or more processors to:
        obtain from a sensor an output waveform representing an output of the switched-mode power supply over a time window at a transition of that output from a first output level to a second output level;
        generate a modified waveform by removing a high frequency component from the output waveform;
        determine a stable value of the modified waveform over a portion of the time window by at least:
            determining an error band based on the output waveform; and
            identifying a first time at which a voltage level of the modified waveform exceeds or is less than the error band, wherein the portion of the time window is bounded by the first time;
        determine, based on the modified waveform and the stable value, an overshoot value at the output of the switched-mode power supply and an undershoot value the switched-mode power supply; and
        output indications of the overshoot and undershoot values.

18. The apparatus of claim 17, wherein the sensor comprises a voltage sensor configured to measure voltage generated by the switched-mode power supply, wherein obtaining the output waveform includes receiving the output waveform from the voltage sensor.

19. The apparatus of claim 17, wherein removing the high frequency component comprises:
    transforming the output waveform into a frequency domain waveform applying a fast Fourier transform to the output waveform;
    applying a low pass filter to the frequency domain waveform to generate a filtered waveform; and
    transforming the filtered waveform into the time domain by applying an inverse fast Fourier transform to the filtered waveform.

20. The apparatus of claim 17, wherein the instructions further cause the one or more processors to:
    determine, based on the modified waveform and the stable value, a value of a settling time at the output of the switched-mode power supply; and
    output an indication of the settling time value.

* * * * *